United States Patent [19]

Mallard, Jr.

[11] Patent Number: 5,341,405
[45] Date of Patent: Aug. 23, 1994

[54] DATA RECOVERY APPARATUS AND METHODS

[75] Inventor: William C. Mallard, Jr., Nashua, N.H.

[73] Assignee: Digital Equipment Corporation, Maynard, Mass.

[21] Appl. No.: 184,892

[22] Filed: Jan. 21, 1994

Related U.S. Application Data

[63] Continuation of Ser. No. 713,302, Jun. 11, 1991, abandoned.

[51] Int. Cl.$^5$ .............................................. H03D 3/24
[52] U.S. Cl. .................................... 375/120; 331/11; 371/1
[58] Field of Search .................. 375/81, 106, 120; 371/1; 331/1 R, 10, 11, 25, 1 A; 370/100, 103

[56] References Cited

U.S. PATENT DOCUMENTS

| | | | |
|---|---|---|---|
| 3,456,026 | 10/1965 | Kwartiroff et al. | 330/32 |
| 3,465,101 | 9/1969 | Christian et al. | 178/68 |
| 3,555,194 | 1/1971 | Goto | 370/103 |
| 3,733,550 | 5/1973 | Tazaki et al. | 325/38 A |
| 3,980,826 | 9/1976 | Widmer | 178/68 |
| 3,993,953 | 11/1976 | Lender et al. | 325/38 A |
| 4,083,010 | 4/1978 | Looschen | 325/321 |
| 4,371,974 | 2/1983 | Dugan | 375/120 |
| 4,380,815 | 4/1983 | Clendening | 375/120 |
| 4,516,248 | 5/1985 | Barclay et al. | 375/76 |
| 4,553,102 | 11/1985 | Yoshida | 329/133 |
| 4,563,767 | 1/1986 | Brandt | 331/11 |
| 4,627,073 | 12/1986 | Sheppard et al. | 375/20 |
| 4,630,286 | 12/1986 | Betts | 375/39 |
| 4,637,036 | 1/1987 | Kobari | 375/76 |
| 4,818,995 | 4/1989 | Takahashi et al. | 341/94 |
| 4,821,298 | 4/1989 | Lagadec et al. | 375/122 |
| 4,823,360 | 4/1989 | Tremblay et al. | 375/4 |
| 4,852,129 | 7/1989 | Schwartz | 375/122 |
| 4,862,485 | 8/1989 | Guinea et al. | 375/120 |
| 4,932,073 | 6/1990 | Ueda | 331/10 |
| 5,097,489 | 3/1992 | Tucci | 375/120 |

FOREIGN PATENT DOCUMENTS

0213641A2  3/1987  European Pat. Off. ................ 25/14

OTHER PUBLICATIONS

"Special Report-FDDI," Lightwave, Feb. 1991, pp. 32–34, 36, 37, 40, and 42–45.
"A 100 Mb/s Clock Recovery and Data Retiming Chip Set" by Kolluri et al.
Product Specification for NE/SA5068 Circuit, Philips Components, 1989.
Product Specification for NE568A Phase-Locked Loop Circuit, Signetics Co., 1988.

Primary Examiner—Stephen Chin
Assistant Examiner—Don N. Vo
Attorney, Agent, or Firm—Kenneth F. Kozik; A. Sidney Johnston

[57] ABSTRACT

Data recovery apparatus for receiving two channels of data signal portions skewed in time and recovering from them two data signal portions synchronized with a con, non clock signal. The apparatus includes a phase comparator circuit and a latch circuit associated with each channel of data signals, a single voltage controlled oscillator that generates a clock signal VCO-CLK in response to a VCO control signal and a single charge pumping circuit for generating the VCO control signal. Each phase comparator circuit receives its associated channel of data signal portions and the VCO-CLK signal and generates pump-up/pump-down signals applied to the charge pumping circuit. Each latch circuit is triggered by a selected edge of the VCO-CLK signal, so that the latch circuits respectively provide recovered data signal portions synchronized with the VCO-CLK signal, which may then be recombined in the same sequence as they were originally divided from a common high data-rate signal.

7 Claims, 4 Drawing Sheets

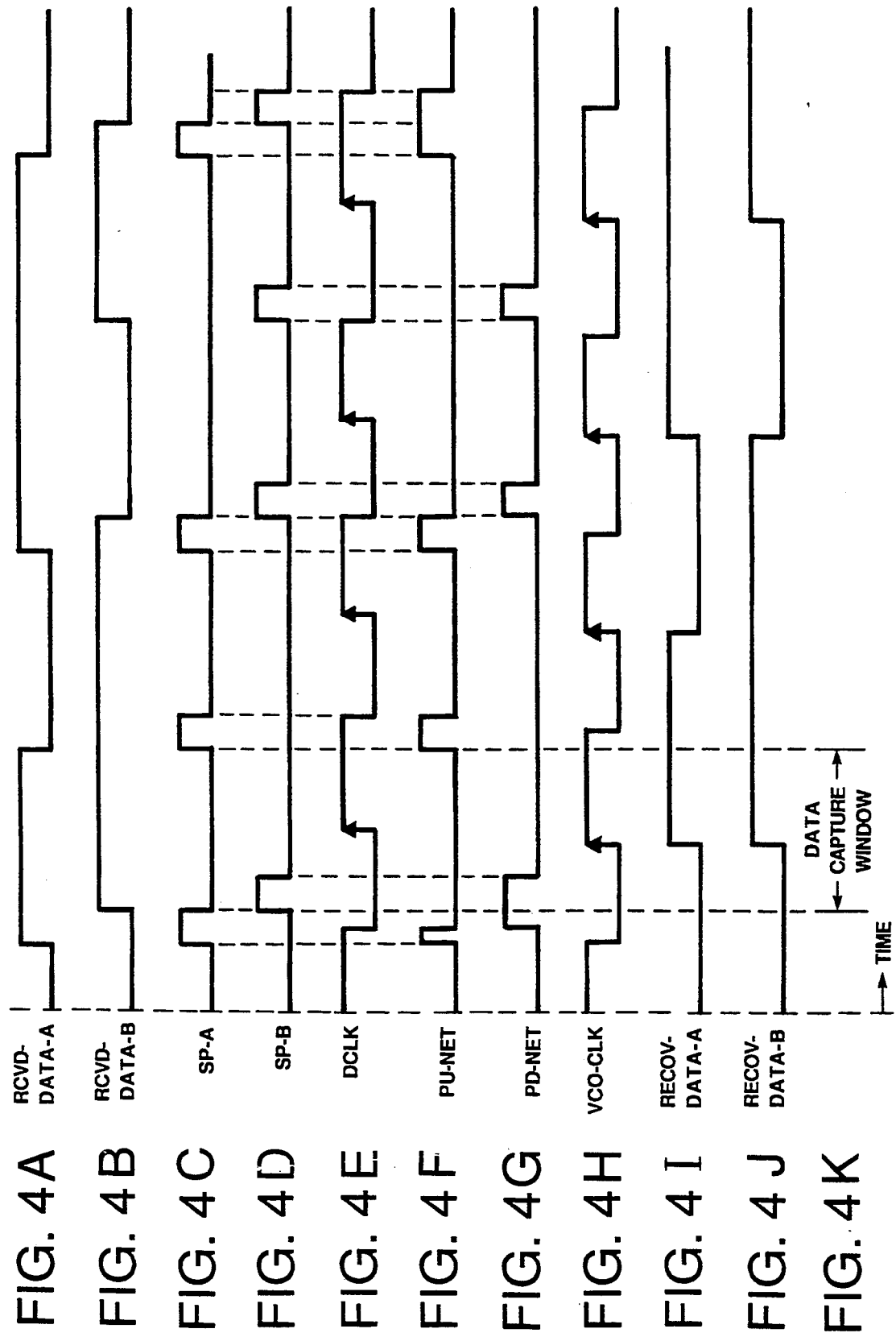

DATA RECOVERY APPARATUS AND METHODS

This application is a continuation of application Ser. No. 07/713,320, filed Jun. 11, 1991, which is abandoned.

BACKGROUND OF THE INVENTION

The present invention is related in general to digital information transmission systems and, more particularly, to data recovery apparatus for use in a digital transmission system in which a high speed data stream is divided and transmitted synchronously on multiple parallel transmission media.

A continuing trend in the development of digital information transmission systems is to increase the bandwidth of transmission media by sending data at a faster data rate. Such transmission media include two-conductor unshielded cable, as can be utilized in telecommunication circuits. However, attempts to increase media bandwidth are restricted by physical limitations on the ability to increase the data transmission rate. For example, an increase in the data transmission rate is accompanied by an increase in the high frequency spectral content of the transmitted signal. Such an increase in the high frequency spectral content results in unacceptably high electromagnetic emission levels that are caused by common mode noise and line imbalance. Also, the levels of electromagnetic emissions resulting from transmission of digital information are subject to conformance with federal and international standards, for example the federal standard established by the Federal Communications Commission. Therefore, the data transmission rate is limited by these considerations.

One solution known in the art for transmitting data carried in a high data-rate data signal while minimizing the problem of high electromagnetic emissions, is the dividing of a high data-rate serial data stream to form multiple parallel data streams that are each transmitted at a correspondingly lower rate. For example, U.S. Pat. No. 4,630,286 discloses apparatus for dividing a single data stream having a data rate of 28.8 kilobits/second into two data streams, each having a data rate of 14.4 kilobits/second, that are then transmitted over two transmission lines.

In conventional systems in which a high data rate serial data stream is divided into multiple data streams for transmission on multiple parallel transmission media at a lower data rate, it is a typical practice to transmit the data on the parallel media in synchronism, such as by driving the transmissions of the two or more data streams in accordance with a single transmission clock signal. Such synchronized transmission is performed to facilitate the proper recovery of the data and the reformation of a single stream of data at the high data rate at the receiving end of the parallel transmission media. A problem experienced with dividing a high data rate data stream results from the different signal propagation speeds on the parallel transmission media, which cause the parallel data streams to fall out of synchronism, such that time skews develop between respective ones of the parallel data streams. These time skews hinder the successful reformation of the single high speed data stream from the parallel low data rate data streams at the receiving end of the parallel transmission media.

Techniques known in the art for reformation of a single high data rate data stream from multiple related streams of low data-rate data skewed in time, require the use of additional circuitry for removal of the time skew. In accordance with techniques known in the art, the reformation of the single high data-rate data stream requires the steps of recovering the data and then removing the skew associated with each one of the low data rate data streams. For example, it is known in the art to utilize separate phase locked loop circuits respectively dedicated to the multiple parallel transmission media to recover each of the multiple low data rate data streams. Then, separate circuitry is utilized to determine and remove the skew in those data streams so that the high data rate data stream can be reformed. Examples of circuitry for eliminating the time skew in each of two or more received data streams are disclosed in U.S. Pat. No. 4,818,995 and the above noted U.S. Pat. No. 4,630,286.

Disadvantageously, the need to provide additional circuitry to remove time skew from each of multiple low data rate data streams adds to both the complexity and cost of data recovery apparatus.

SUMMARY OF THE INVENTION

The present invention has been made in view of the above circumstances and has as an object to provide data recovery apparatus for recovering data from multiple low data-rate data streams, without requiring the use of separate circuitry to eliminate the time skew from the data streams.

Additional objects and advantages of the invention will be set forth in part in the description which follows and in part will be obvious from the description, or may be learned by practice of the invention. The objects and advantages of the invention may be realized and obtained by means of the instrumentalities and combinations particularly pointed out in the appended claims.

To achieve the objects and in accordance with the purpose of the invention, as embodied and broadly described herein, the present invention is directed to data recovery apparatus for the recovery of N channels of binary and/or equivalent encoded versions of data signal portions from N effectively separate transmission paths, where N is an integer, the N channels of binary data signal portions being respectively transmitted in synchronism into the N transmission paths. The data recovery apparatus comprises voltage-controlled oscillator (VCO) means, responsive to a VCO control signal, for generating a VCO clock signal having the frequency (determined by the VCO control signal, and phase comparator means, responsive to the VCO clock signal and the N channels of binary data signal portions, for providing a phase difference control signal which represents phase differences between the VCO clock signal and the N channels of binary data signal portions. The data recovery apparatus also comprises memory means, including inputs for receiving the N channels of binary data signal portions and responsive to the VCO clock signal, for storing data of the N channels of binary data signal portions at a predetermined phase of each clock period of the VCO clock signal, and control means, responsive to the phase difference control signal, for generating the VCO control signal effective to maintain a relatively low respective phase difference between the VCO clock signal and each of the N channels of binary data signal portions.

The present invention is also directed to a method for recovering N channels of data signal portions from N effectively separate transmission paths, where N is an integer, the N channels of data signal portions being respectively transmitted in synchronism into the N transmission paths. The method comprises the steps of generating a VCO clock signal having a phase determined by a VCO control signal and providing a phase difference control signal which represents phase differences between the VCO clock signal and the N channels of data signal portions. The method also included the steps of storing data of the N channels of data signal portions at a predetermined phase of each clock period of the VCO clock signal and generating the VCO control signal effective to maintain a relatively low respective frequency difference between the VCO clock signal and each of the N channels of data signal portions.

BRIEF DESCRIPTION OF THE DRAWINGS

The accompanying drawings, which are incorporated in and constitute a part of this specification illustrate embodiments of the invention and, together with the description, serve to explain the objects, advantages, and principles of the invention. In the drawings.

FIGS. 4A–J are timing diagrams of signals occurring in the data recovery circuit shown in FIG. 3, and FIG. 4K illustrates a data capture window.

DESCRIPTION OF THE PREFERRED EMBODIMENTS

Figure 1:
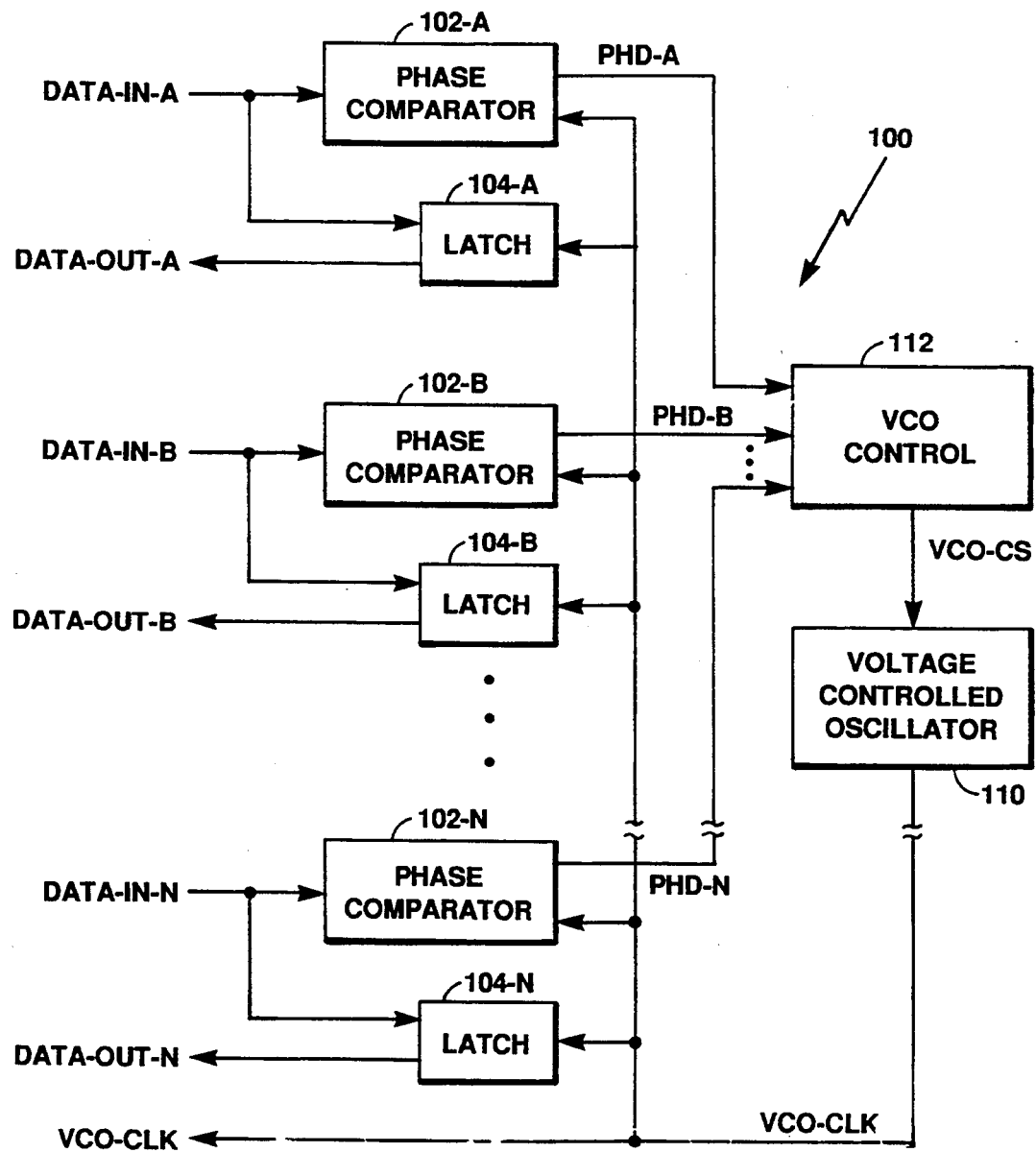
FIG. 1 illustrates a data recovery circuit constructed in accordance with the invention.

Referring now to the drawings, FIG. 1 broadly illustrates a data recovery circuit 100, constructed in accordance with the invention, for receiving a plurality of portions of a data signal skewed in time and detecting and providing the data in the received signal in accordance with a common clock signal. Circuit 100 is connected at a receiving end of N transmission paths, such as N two-conductor transmission lines, to receive N portions of a digital data signal, which portions were transmitted onto the N lines in synchronism with one another at a remote transmitting end of the N lines. For example, the N portions may have been produced by dividing a high data-rate serial data stream into N lower data-rate data streams, each of which was transmitted on a respective one of the N transmission lines in synchronism with a common transmitting clock signal. As used herein, such synchronized transmission means that the edge transitions of the respective N data signals all occurred in synchronism with the common clock signal at the transmitter, or sending end of the system. It is assumed that as a result of different signal propagation speeds on the N transmission lines the N portions of the data stream, as received at the receiving end of the N transmission lines, are no longer in synchronism. It is also assumed that the received N data signal portions have each undergone initial signal conditioning, examples of which are described below, and are provided as binary data signal portions DATA-IN-A, DATA-IN-B, . . . , DATA-IN-N.

Circuit 100 includes N phase comparator circuits 102-A, 102-B, . . . , 102-N respectively connected to receive the N data signal portions. Circuit 100 also includes N data storage circuits provided as latch circuits 104-A, 104-B, . . . , 104-N respectively connected to receive the N data signal portions. Circuit 100 further includes a voltage-controlled oscillator circuit (VCO) 110 which generates a clock signal VCO-CLK having a frequency which is responsive to a VCO control signal VCO-CS applied thereto. Each of phase comparators 102-A, 102-B, . . . , 102-N are connected to receive the clock signal VCO-CLK, and are constructed to detect the phase difference between edge transitions of the received data signal and successive edges of either the rising edges or the falling edges of clock signal VCO-CLK and to respectively provide phase difference signals PHD-A, PHD-B, . . . PHD-N which represent a leading or lagging phase difference between the clock signal VCO-CLK and data signals DATA-IN-A, DATA-IN-B, . . . , DATA-IN-N. Each of latch circuits 104-A, 104-B, . . . , 104-N is connected to receive clock signal VCO-CLK.

Circuit 100 additionally includes a VCO control circuit 112 for receiving phase difference signals PHD-A, PHD-B, . . . , PHD-N and providing the VCO control signal VCO-CS to reflect the phase differences detected by phase comparators 102-A, 102-B, . . . , 102-N. To the extent that the respective data signals DATA-IN-A, DATA-IN-B, . . . , DATA-IN-N are skewed in time with respect to each other, i.e., are out of synchronism, it is impossible for the single clock signal VCO-CLK to be simultaneously synchronized to all of the data signals. However, since VCO control circuit 112 generates the VCO control signal VCO-CS in accordance with the phase difference signals PHD-A, PHD-B, . . . , PHD-N, clock signal VCO-CLK is controlled to maintain a frequency that represents an optimum "synchronism," i.e., short-term substantially constant phase relationships, with the N data signals. That is, VCO control circuit 112 controls the frequency of the clock signal VCO-CLK to optimally maintain relatively low phase differences between signal VCO-CLK and the N data signal portions. It may be seen that there is no true "phase lock" condition, inasmuch as the causes of the skews may be slowly fluctuating.

In the operation of data recovery circuit 100, data streams DATA-IN-A, DATA-IN-B, . . . , DATA-IN-N are received at phase comparators 102-A, 102-B, . . . , 102-N, respectively, where those data streams are compared with clock signal VCO-CLK. Phase comparators 102-A, 102-B, . . . , 102-N respectively output phase difference signals PHD-A, PHD-B, . . . , PHD-N representing the phase difference between clock signal VCO-CLK and data signals DATA-IN-A, DATA-IN-B, . . . , DATA-IN-N, respectively. VCO control circuit 112 receives the phase difference signals PHD-A, PHD-B, . . . , PHD-N and generates clock signal VCO-CLK in accordance therewith.

Since as described above, clock signal VCO-CLK is generated to optimally maintain a relatively low phase difference with respect to each of the data signal portions, the clock signal is used to trigger the storage in each latch circuit of the data signal portion applied to the latch circuit. For example, if phase comparators 102-A, 102-B, . . . , 102-N are constructed to detect the phase difference between each successive one of the rising or falling edge of the clock signal VCO-CLK and edge transitions of the data, then each falling or rising edge, respectively, of the clock signal VCO-CLK is used to cause the storage of data, such as by triggering latch circuits 104-A, 104-B, . . . , 104-N.

As more fully described below with respect to a preferred construction of data recovery circuit 100, since the phase differences are maintained with respect to successive rising or falling edges of clock signal VCO-CLK, the falling or rising edges of clock signal VCO-CLK, respectively, are temporally spaced from the edge transitions of the data and therefore demark an optimal point in time to detect the respective logic levels of the N received data signal portions. As a result, the data stored in latch circuits 104-A, 104-B, . . . , 104-N during successive clock periods constitute respective streams of detected data DATA-OUT-A, DATA-OUT-B, . . . , DATA-OUT-N, respectively, that are in synchronism with clock signal VCO-CLK, and are in fact re-timed to be truly in phase therewith, when exiting the latch circuits.

Then, under control of clock signal VCO-CLK, the synchronized data streams DATA-OUT-A, DATA-OUT-B, . . . , DATA-OUT-N can be merged, in accordance with techniques known in the art (with the same order of sequencing as was sent from the transmitter), to form a high data rate data stream having a data rate that is N times the rate of clock signal VCO-CLK. Thus, data recovery circuit 100 enables the detection and resynchronization of the N data streams received out of synchronism, without the use of separate circuitry to determine and eliminate the time skew in each received data stream.

Figure 2:
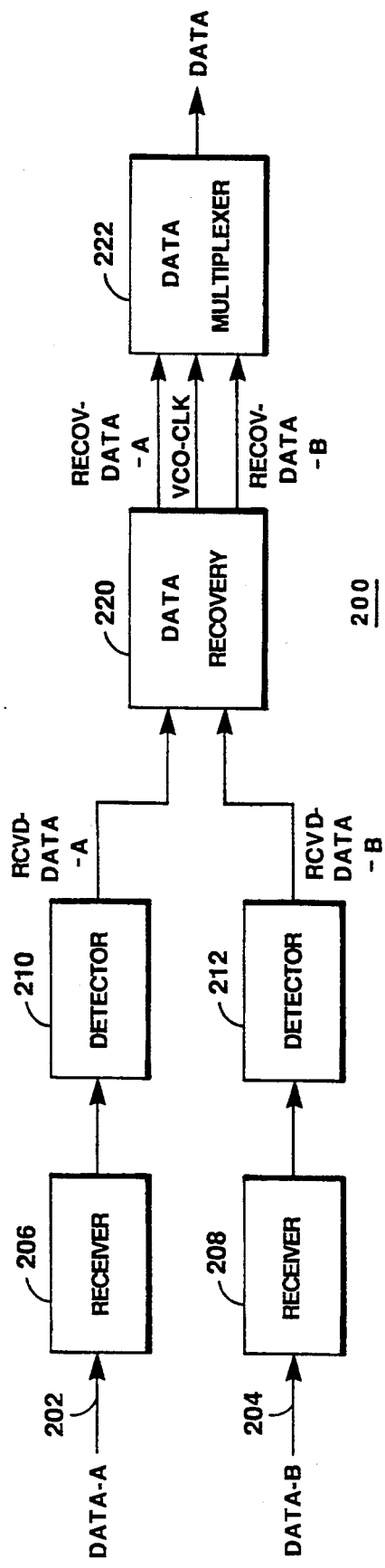
FIG. 2 illustrates a data recovery system constructed in accordance with the invention.

FIG. 2 illustrates an embodiment of a data recovery system 200, constructed in accordance with the invention, for recovering a data signal received as two data signal portions, identified as DATA-A and DATA-B, on respective two-conductor transmission lines 202 and 204, respectively. As used herein, two-conductor transmission lines include, but are not limited to, shielded and unshielded twisted pair cable, twin-axial cable and flat-line cable. In the illustrated embodiment, the two received data signal portions are each assumed to be a stream of multi-level encoded data, such as modified duobinary encoded data. However, the data portions may take other forms known in the art without constraining the data recovery practiced in accordance with the present invention. It is also assumed that the two data signal portions DATA-A and DATA-B were generated by dividing an original high data-rate serial binary data signal at the transmitting end of lines 202 and 204 according to a selected repetitive scheme. For example, data signal portions DATA-A and DATA-B may each have been transmitted at a data rate of 62.5 Mbits/sec, while an original high data rate binary signal from which they were divided had a data rate of 125 Mbits/second. It is further assumed that the data signal portions DATA-A and DATA-B were transmitted in synchronism on transmission lines 202 and 204. As described above, such synchronized transmission can be effected by transmitting the signals on lines 202 and 204 in accordance with a single transmission clock signal. As a result, the edge transitions of both data signal portions DATA-A and DATA-B occurred in synchronism with the transmission clock signal upon transmission. Also as described above, due to differences in signal propagation speeds on different transmission media paths, it is assumed that signal portions DATA-A and DATA-B, as received by data recovery system 200, are no longer in synchronism with each other, i.e., the signals are skewed in time, typically by less than one period of the transmission clock. If the skew occasionally becomes greater, any of various known error detection and/or error correction techniques can be effectively employed.

The data signals received on lines 202 and 204 are respectively applied to receiver circuits 206 and 208. Each of receiver circuits 206 and 208 is of a conventional construction and is provided to terminate the transmission line. Each of circuits 206 and 208 can include a line termination network, line equalizer circuitry for flattening the total channel frequency response across the channel bandwidth, and automatic gain control circuitry to compensate for signal amplitude loss. After conditioning by receivers 206 and 208, the received signals are applied to detector circuits 210 and 212. Detector circuits 210 and 212 are each provided for converting the received multi-level data, such as a three-level modified duobinary data, to two-level data, in order to simplify the recovery of data therefrom. The conversion function performed by each of detector circuits 210 and 212 is well known in the art and the invention can be successfully practiced with a conventional construction of circuits 210 and 212. In the illustrated embodiment, detector circuits 210 and 212 respectively provide two-level data signal portions RCVD-DATA-A and RCVD-DATA-B.

The two-level signal portions RCVD-DATA-A and RCVD-DATA-B are applied to a data recovery circuit 220 constructed in accordance with the invention, such as embodied in the features described above with respect to data recovery circuit 100 (FIG. 1). Thus, data recovery circuit 220 is configured to detect the data levels in both two-level signal portions and to provide two recovered two-level signal portions, having the detected data levels, in synchronism with a con, non clock signal. In accordance with the invention, such synchronism means that edge transitions of both recovered signals occur at transitions of the common clock signal. In the illustrated embodiment, the two signal portions provided by data recovery circuit 220 are designated RECOV-DATA-A and RECOV-DATA-B, and the common clock signal with which they are synchronized is designated VCO-CLK.

The two recovered data signal portions and associated common clock signal VCO-CLK provided by data recovery circuit 220 are applied to a data multiplexer circuit 222. Circuit 222 forms a serial binary data signal, designated DATA-C, from the data of the two recovered signal portions. Signal DATA-C has a data rate that is two times the rate of each of the recovered signal portions RECOV-DATA-A and RECOV-DATA-B. Thus, in the illustrated embodiment, circuit 222 reconstructs the serial binary signal DATA-C corresponding to the high data-rate signal originally divided at the transmitting end of transmission lines 202 and 204.

Figure 3:
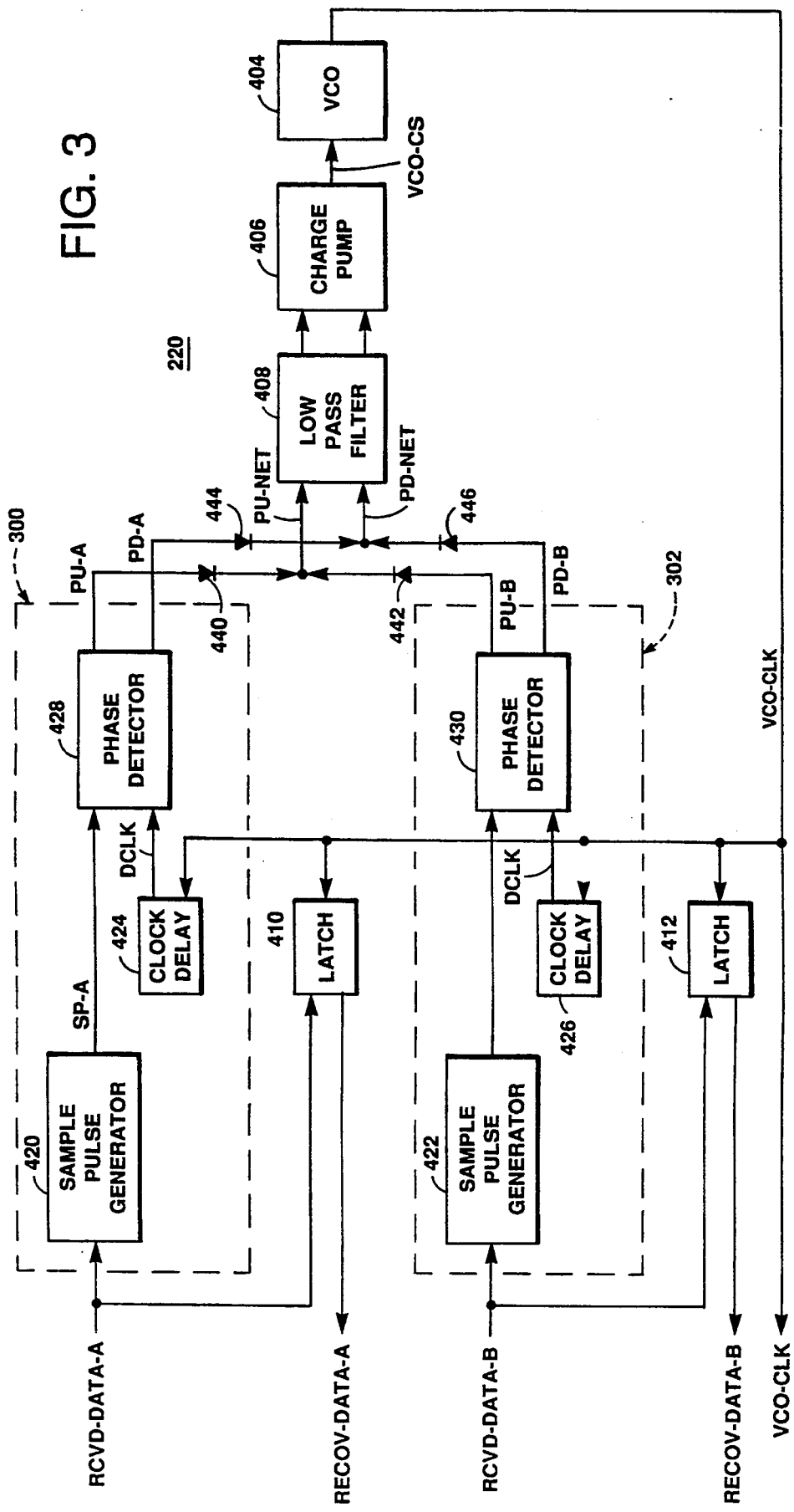
FIG. 3 illustrates a preferred construction of a data recovery circuit included in the system illustrated in FIG. 2.

FIG. 3 illustrates a preferred construction of data recovery circuit 220. Circuit 220 includes phase comparator circuits 300 and 302 respectively connected to receive signal portions RCVD-DATA-A and RCVD-DATA-B. Referring also to FIGS. 4A and 4B, those figures respectively illustrate exemplary signal portions RCVD-DATA-A and RCVD-DATA-B.

Circuit 220 also includes a voltage controlled oscillator (VCO) circuit 404 connected to receive a VCO control signal VCO-CS from a VCO control circuit provided as a charge pumping circuit 406. VCO circuit 404 generates a clock signal VCO-CLK in accordance with the control signal VCO-CS. An exemplary signal VCO-CLK is illustrated in FIG. 4H.

Each of phase comparator circuits 300 and 302 are connected to receive the clock signal VCO-CLK. Circuit 300 is constructed to detect a phase difference between data signal portion RCVD-DATA-A and clock signal VCO-CLK and generates a pump-up signal PU-A and/or a pump-down signal PD-A as a function of the detected phase difference. In similar fashion, circuit 302 detects a phase difference between data signal portion RCVD-DATA-B and clock signal VCO-CLK and generates a pump-up signal PU-B and/or a pump-down signal PD-B as a function of the detected phase difference.

Charge pumping circuit 406 is connected to receive the pump-up and pump-down signals through a low pass filter 408 and provides control signal VCO-CS in accordance therewith.

Data recovery circuit 220 further includes latch circuits 410 and 412 which are respectively connected to receive the data signal portions RCVD-DATA-A and RCVD-DATA-B. Latch circuits 410 and 412 are also connected to receive the clock signal VCO-CLK. Latch circuits 410 and 412 are responsive to a predetermined one of the rising or falling edges of clock signal VCO-CLK to latch the data being received at that instant and to provide the latched data on its output. The latching operation represents the synchronization of the received data paths. As a result, latch circuits 410 and 412 respectively provide the synchronized data in synchronism with clock signal VCO-CLK as recovered data signal portions RECOV-DATA-A and RECOV-DATA-B. FIGS. 4I and 4J respectively illustrate exemplary data streams RECOV-DATA-A and RECOV-DATA-B.

One manner in which circuit 220 can be constructed is by providing phase comparator circuit 300 and latch circuit 410 as included in a part no. NE/SA5068 clock recovery circuit manufactured by Signetics Company of Sunnyvale, Calif., by providing phase comparator 302 and latch circuit 412 as included in another one of the above noted part no. NE/SA5068 circuits, and by providing charge pumping circuit 406 and VCO 404 as included in a part no. NE568A phase locked loop circuit also manufactured by Signetics Company. Further features of circuit 220 and the operation thereof when so constructed are described next. Aspects of the operation of the NE/SA5068 and NE568A circuits are described in "A 100 Mb/s Clock Recovery and Data Retiming Chip Set" by Kolluri et al. of Signetics Company, for the individual parts used in more conventional contexts.

In FIG. 3, phase comparator circuit 300, as provided in the NE/SA5068 circuit, is illustrated as a simplified functional block design diagram of the functions performed within the NE/SA5068 circuit and described herein in terms selected to facilitate explanation of the present invention. Thus, circuit 300 includes a sample pulse generator circuit 420 which generates a sample pulse signal SP-A at the occurrence of each rising and falling edge of signal portion RCVD-DATA-A. The successive sample pulse signals generated by circuit 420 have the same duration, which is fixed by circuit 420. FIG. 4C illustrates the signals SP-A generated at successive edge transitions of signal portion RCVD-DATA-A.

Phase comparator 302, as provided in another NE/SA5068 circuit includes a sample pulse generator circuit 422 which is the same as circuit 420 and generates a sample pulse signal SP-B at the occurrence of each rising and falling edge of signal portion RCVD-DATA-B. The duration of each signal SP-B is the same as the duration of each signal SP-A and is fixed by circuit 422. FIG. 4D illustrates the signals SP-B generated at successive edge transitions of signal portion RCVD-DATA-B. The illustrated widths of pulses SP-A and SP-B are exaggerated to facilitate an explanation of the operation of circuit 220.

Phase comparator circuits 300 and 302, each provided in the NE/SA5068 circuit, respectively include clock delay circuits 424 and 426 which are connected to receive the signal VCO-CLK generated by VCO circuit 404. Each of circuits 424 and 426 provide a delayed clock signal DCLK which is delayed relative to the signal VCO-CLK by one-half the duration of sample pulse signals SP-A or SP-B. Since in the illustrated embodiment the durations of sample pulse signals SP-A and SP-B are equal, clock delay circuits 424 and 426 generate substantially identical delayed clock signals DCLK. FIG. 4E illustrates an exemplary signal DCLK.

Phase comparator circuits 300 and 302, each provided as the NE/SA5068 circuit, further respectively include phase detector circuits 428 and 430. Phase detector circuit 428 is connected to receive sample pulse signal SP-A and the delayed clock signal DCLK. Phase detector circuit 430 is connected to receive sample pulse signal SP-B and delayed clock signal DCLK.

Phase detector 428 as provided in the NE/SA5068 circuit, includes logic for generating signals PU-A and PD-A having durations which respectively represent an amount of phase shift by which signal DCLK lags or leads signal SP-A, subject to a maximum duration equal to the width of sample pulse signal SP-A. Phase detector circuit 430 operates in the same manner as phase detector circuit 428 to provide pump-up signal PU-B and/or pump-down signal PD-B to have durations which respectively represent an amount of phase shift by which signal DCLK lags or leads sample pulse signal SP-B.

Figure 5:
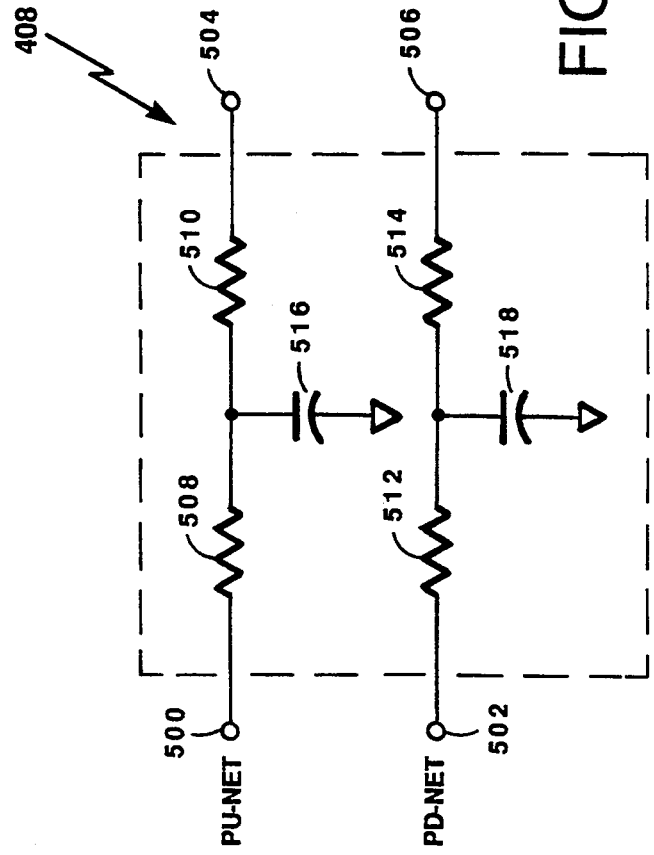
FIG. 5 illustrates a filter circuit included in the data recovery circuit shown in FIG. 3.

In accordance with a feature of the invention, signals PU-A and PU-B are combined by their wired OR connection through diodes 440 and 442. The result of the OR logic is designated as signal PU-NET and an exemplary signal PU-NET is illustrated in FIG. 4F. Similarly, signals PD-A and PD-B are logically OR connected through diodes 444 and 446 and the signal resulting from this OR logic is designated PD-NET. An exemplary signal PD-NET is illustrated in FIG. 4G. Signals PU-NET and PD-NET are filtered through low pass filter 406 to remove noise components. An exemplary construction of filter 408 is illustrated in FIG. 5. Filter 408 includes input terminals 500 and 502 for respectively receiving signals PU-NET and PD-NET, and output terminals 504 and 506 on which the filtered signals, shown in FIG. 5 PU-NET' and PD-NET', are provided. Resistors 508 and 510 are connected in series between terminals 500 and 504, and resistors 512 and 514 are connected in series between terminals 502 and 506. A capacitor 516 is connected at one end between resistors 508 and 510, and at the other end to ground potential. A capacitor 518 is connected at one end between resistors 512 and 514, and at the other end to ground potential. In the particular construction of circuit 220 currently being described, each of resistors 508–514 has a value of 1.33K ohms and each capacitor 516 and 518 has a value of 47 pF.

The filtered signals PU-NET and PD-NET are applied to charge pumping circuit 406. Charge pumping circuit 406 generates an analog control signal, designated VCO-CS herein for the purpose of explanation, in response to the signals PU-NET and PD-NET, which is applied to VCO circuit 404. VCO circuit 404 increases or decreases the frequency of signal VCO-CLK as the magnitude of the signal VCO-CS increases or decreases, respectively. As noted above, in the particular construction of circuit 220 currently being described, the functions performed by VCO circuit 404 and charge pumping circuit 406 are provided in the NE568A circuit.

In the implementation of the NE568A circuit, it is also necessary to connect a timing capacitor across pins 4 and 5 of that circuit to set a nominal operating frequency of the VCO circuit. In the particular construction of circuit 220, a 10 pF capacitor is connected across pins 4 and 5 and each of those pins is also connected to ground through an 820 ohm resistor. This capacitance sets a nominal frequency of 125 MHZ. Since each of signal portions RCVD-DATA-A and RCVD-DATA-B has a data rate of 62.5 MHZ, it is necessary to halve the frequency of the generated signal to provide signal VCO-CLK at a nominal frequency of 62.5 MHZ prior to applying it to latch circuits 410 and 412 and phase comparators 300 and 302. However, the 125MHZ signal can be used in conjunction with the reformed high data rate signal created from signal portions RECOV-DATA-A and RECOV-DATA-B.

The NE568A circuit outputs the clock signal generated therein as a differential signal across pins 19 and 20. While not shown in FIG. 3, the halving of the nominal frequency of the outputted clock signal can be performed by connecting pins 19 and 20 to the inputs of a differential amplifier, and connecting an output of that amplifier to the clock input of a D-flip-flop circuit. Then, the signal VCO-CLK is provided as a differential signal across the Q and $\overline{Q}$ outputs of the flip-flop circuit.

Also in the implementation of the NE568A circuit, it is preferred herein to connect the series combination of a 511 ohm resistor and 6.8 $\mu$F capacitor between pin 17 and ground, and to connect another series combination of those two circuit elements between pins 14 and 18. These circuit elements control the time constant of the integrating function performed by the charge pumping circuit within the NE568A circuit.

In the overall operation of system 200, multi-level data signal portions DATA-A and DATA-B which are out of synchronism, are received on transmission lines 202 and 204. The received signal portions are conditioned in receiver circuits 206 and 208 and applied to detector circuits 210 and 212 which provide the two-level signal portions RCVD-DATA-A and RCVD-DATA-B. Data recovery circuit 220 receives the two-level signal portions RCVD-DATA-A and RCVD-DATA-B that are skewed in time and generates the two recovered data signal portions RECOV-DATA-A and RECOV-DATA-B that are synchronized with clock signal VCO-CLK. Then data multiplexer circuit 222 forms the signal DATA-C that has a data rate which is twice that of the two recovered data signal portions and that corresponds to the original data stream which was divided at the transmitting end of transmission lines 202 and 204.

In data recovery circuit 220, sample pulse generator circuits 420 and 422 receive the two-level signal portions RCVD-DATA-A and RCVD-DATA-B and responsively generate sample pulse signals as SP-A and SP-B, respectively. Phase detector circuits 428 and 430 respectively receive signals SP-A and SP-B as well as the delayed clock signal DCLK and generate the above-noted pump-up and pump-down signals. As a result and as illustrated in FIGS. 4C-4G, the generation of pump-up signal PU-A is commenced, if at all, at the rising edge of sampling signal SP-A if a selected one of the rising or falling edges, in this example the falling edge, of signal DCLK occurs during or after signal SP-A. Pump-up signal PU-A is terminated at the earlier occurrence of the falling edge of signal SP-A or the falling edge of signal DCLK. As previously noted, signal PU-A can have a duration no greater than the width of the sampling pulse signal. Also, if the falling edge of signal DCLK' occurs at or prior to the rising edge of sample signal SP-A, signal PU-A is not generated.

The generation of the pump-down signal PD-A is commenced, if at all, at the rising edge of sampling signal SP-A if that rising edge occurs after the falling edge of signal DCLK, or at the falling edge of signal DCLK if that falling edge occurs during signal SP-A. Signal PD-A is terminated at the falling edge of signal SP-A. Signal PD-A can have a duration no greater than the width of signal SP-A. Also, if the falling edge of signal DCLK occurs at or after the falling edge of signal SP-A, signal PD-A is not generated.

It is important to note that, as will be recognized by those skilled in the art, terms such as "rising" and "falling" for describing signal edge transitions with respect to the generation of the pump-up and pump-down signals are relative terms and are not intended to be limiting.

Thus, a synchronized state exists between signal VCO-CLK and signal portion RCVD-DATA-A when the falling edge of signal DCLK occurs at the midpoint of the sample signal SP-A. This synchronized state results in signals PU-A and PD-A being generated with equal durations. Further, since signal DCLK is generated with a delay equal to one-half the duration of SP-A, this synchronized state corresponds to the falling edge of signal VCO-CLK occurring at an edge transition of data signal portion RCVD-DATA-A.

The generation of signals PU-B and PD-B is accomplished in the same manner as described for signals PU-A and PD-A.

In accordance with the invention, signals PU-NET and PD-NET, respectively illustrated in FIGS. 4F and 4G, are produced by combining, by wire OR-ing, the pump-up and the pump-down signals separately generated by phase detector circuits 428 and 430. As a result of the manner in which the pump-up and pump-down signals are generated, the durations of signals PU-NET and PD-NET respectively represent net or average amounts by which the signal DCLK lags or leads the two data signal portions RCVD-DATA-A and RCVD-DATA-B. Charge pump circuit 406 varies the magnitude of the signal VCO-CS in accordance with the respective durations of signals PU-NET and PD-NET. As a result, since sample signals SP-A and SP-B are respectively generated at the edge transitions of data signal portions RCVD-DATA-A and RCVD-DATA-B, the phase difference between signal VCO-CLK and both data signal portions RCVD-DATA-A and RCVD-DATA-B is optimally minimized.

Thus, the operation of data recovery circuit 220 constructed as described above results in a maintained relatively low phase difference between each selected, e.g., falling, edge of signal VCO-CLK and edge transitions of both data signal portions RCVD-DATA-A and RCVD-DATA-B. Latch circuits 410 and 412 are therefore triggered at each nonselected, e.g., rising, edge of signal VCO-CLK to detect the data pulses at points remote from edge transitions to thereby minimize the detection error rate. Therefore, the two recovered data signal portions RECOV-DATA-A and RECOV-DATA-B are respectively provided on the outputs of latch circuits 410 and 412 in synchronism with signal VCO-CLK.

FIG. 4K illustrates a data capture window for a first clock period of signal VCO-CLK defined by operation of the present invention. As seen in FIG. 4K, the data capture window commences, or opens, at the later occurring edge transition of the two data signal portions RCVD-DATA-A and RCVD-DATA-B, and terminates, or closes, at the next earlier occurring edge transition of the two data signals. Thus the operation of the invention defines the data capture window, during each period of signal VCO-CLK, during which the data values of the respective received data signals can be detected in synchronism.

While a particular construction of a phase comparator circuit has been described, the invention is not so limited. Other techniques are known in the art for detecting a phase difference between a data signal and clock signal and generating an error signal in proportion thereto, and the invention can be successfully practiced with such other known techniques.

While embodiments have been illustrated and described for the recovery of data from two-conductor transmission lines, the present invention is readily applicable to the recovery of data received on other forms of transmission paths such as radio propagation paths or paths in an integrated or optical circuit.

While the adjustment of the phase of the clock signal VCO-CLK has been described herein as being effected by the adjustment of the magnitude of the control signal VCO-CS, other means are known in the art for effecting such phase adjustment of a clock signal and the present invention can be successfully practiced with such other means.

The foregoing description of the preferred embodiments and examples of the invention have been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. Data recovery apparatus for the synchronized recovery of first and second channels of data signal portions from first and second parallel transmission media, the first and second channels of data signal portions being transmitted in synchronism into the first and second transmission media, said data recovery apparatus comprising:

voltage-controlled oscillator (VCO) means, responsive to a VCO control signal, for generating a VCO clock signal;

phase comparator and latch means, responsive to the VCO clock signal and the first and second channels of data signal portions, for generating data corresponding to data of the first and second channels of data signal portions at a predetermined phase of each clock period of the VCO clock signal;

control means responsive to said phase comparator for generating the VCO control signal effective to maintain a stable relatively low phase difference between the VCO clock signal and each of the first and second channels of data signal portions;

said phase comparator and latch means includes means for providing a phase difference control signal which represents respective phase differences between the VCO clock signal and the first and second channels of data signal portions; and said control means generating the VCO control signal in response to the phase difference control signal;

said phase difference control signal includes first and second control signals which represent phase differences between the VCO clock signal and the first and second channels of data signal portions, respectively;

said phase comparator and latch means comprising:

first phase Comparator means, responsive to the VCO clock signal and the first channel of data signal portions, for providing the first control signal; and second phase comparator means, responsive to the VCO clock signal and the second channel of data signal portions, for providing the second control signal;

said VCO clock signal consists of a periodic succession of alternate rising and falling clock edges, each successive VCO clock period including a rising and a falling clock edge, the first and second channels of data each consisting of a succession of alternate rising and falling edges;

said first phase comparator means including
first means for initiating a first sampling signal at each rising and falling edge of the first channel of data signal portions, each said first sampling signal having a first predetermined duration,
first delay means for delaying said VCO clock signal by one-half the first predetermined duration to provide a first delayed clock signal, and
means, responsive to the first delayed clock signal and the first sampling signal, for providing the first control signal according to a phase difference between a selected one of the rising and falling clock edges of the first delayed clock signal and the first sampling signal; and said second phase comparator means including
second means for initiating a second sampling signal for each rising and falling edge of the second channel of data signal portions, each said second sampling signal having a second predetermined duration,
second delay means for delaying said VCO clock signal by one-half the second predetermined duration to provide a second delayed clock signal, and
means, responsive to the second delayed clock signal and the second sampling signal, for providing the second control signal according to a phase difference between a selected one of the rising and falling edges of the second delayed clock signal and the second sampling signal;

so that said control means generates the VCO control signal with a magnitude effective to control said VCO means to generate the VCO clock signal with the selected one of the rising and falling edges of each clock period occurring at or near the rising and falling edges of both the first and second channels of data signal portions.

2. The data recovery apparatus of claim 1 wherein:

the first control signal consists of a first leading signal and a first lagging signal, the first leading and lagging signals representative of amounts by which the selected edge of the first delayed clock signal leads and lags the first sampling signal, respectively; and the second control signal consists of a second leading signal and a second lagging signal, the second leading and lagging signals representative of amounts by which the selected edge of the VCO clock signal leads and lags the second sampling signal, respectively.

3. The data recovery apparatus of claim 2 wherein:

said VCO means is responsive to the VCO control signal to adjust the frequency of the VCO clock signal as a direct function of the magnitude of the VCO control signal;

said data recovery apparatus further including means for combining the first and second leading signals to provide a net leading signal, and for combining the first and second lagging signals to provide a net lagging signal; and said control means includes charge pumping means, responsive to the net leading and lagging signals for decreasing the magnitude of the VCO control signal in response to the net leading signal and increasing the magnitude of the VCO control signal in response to the net lagging signal.

4. The data recovery apparatus of claim 3 further including low pass filter means for filtering the net leading and lagging signals.

5. The data recovery apparatus of claim 1 wherein the first and second predetermined durations are equal.

6. The data recovery apparatus of claim 1 wherein the selected edges of the first and second delayed clock signals are the same edges;

said phase comparator and latch means including:

first latch means, having a data output and inputs for respectively receiving the first channel of data signal portions and the VCO clock signal, for storing data of the first channel of data signal portions upon each non-selected one of the rising and falling edges of the VCO clock signal and for providing the stored data on its data output; and second latch means, having a data output and inputs for respectively receiving the second channel of data signal portions and the VCO clock signal, for storing data of the second channel of data signal portions upon each non-selected one of the rising and falling edges of the VCO clock signal and for providing the stored data on its data output.

7. The data recovery apparatus of claim 6 wherein:

the first control signal consists of a first leading signal and a first lagging signal, the first leading and lagging signals representative of amounts by which the selected edge of the first delayed clock signal leads and lags the first sampling signal, respectively; and the second control signal consists of a second leading signal and a second lagging signal, the second leading and lagging signals representative of amounts by which the selected edge of the second delayed clock signal leads and lags the second sampling signal, respectively.

* * * * *